(12) United States Patent
Zhang et al.

(10) Patent No.: US 8,795,770 B2
(45) Date of Patent: Aug. 5, 2014

(54) PREPARATION OF MIST, PROCESS AND APPARATUS FOR FORMING NEW MATERIALS BY MIST GAS DISCHARGE

(75) Inventors: Yifei Zhang, Beijing (CN); Xinhui Zhang, Beijing (CN)

(73) Assignee: Beijing Tough & Lubricating Institute, Beijing (CN)

( * ) Notice: Subject to any disclaimer, the term of this patent is extended or adjusted under 35 U.S.C. 154(b) by 457 days.

(21) Appl. No.: 13/127,342

(22) PCT Filed: Sep. 15, 2009

(86) PCT No.: PCT/CN2009/001035
§ 371 (c)(1),
(2), (4) Date: Jul. 12, 2011

(87) PCT Pub. No.: WO2010/060259
PCT Pub. Date: Jun. 3, 2010

(65) Prior Publication Data
US 2011/0268889 A1    Nov. 3, 2011

(30) Foreign Application Priority Data
Nov. 3, 2008   (CN) .......................... 2008 1 0172701

(51) Int. Cl.
*C23C 8/06*       (2006.01)
*C23C 8/36*       (2006.01)
*D06M 16/00*      (2006.01)
*H01J 37/32*      (2006.01)
*C23C 10/06*      (2006.01)
*D06M 14/18*      (2006.01)
*D06M 11/09*      (2006.01)
*C23C 14/48*      (2006.01)

(52) U.S. Cl.
CPC ... *C23C 8/06* (2013.01); *C23C 8/36* (2013.01); *D06M 16/00* (2013.01); *H01J 37/32018* (2013.01); *C23C 10/06* (2013.01); *H01J 37/32522* (2013.01); *H01J 37/32055* (2013.01); *H01J 37/3244* (2013.01); *D06M 14/18* (2013.01); *D06M 11/09* (2013.01); *C23C 14/48* (2013.01)
USPC ....................................... 427/248.1

(58) Field of Classification Search
USPC .............................................. 427/248.1, 901
See application file for complete search history.

(56) References Cited

U.S. PATENT DOCUMENTS 6,101,316 A *   8/2000  Nagashima et al. .......... 392/388
2004/0253475 A1* 12/2004 Upchurch .................... 428/654
(Continued)

FOREIGN PATENT DOCUMENTS

CN      1097221 A     1/1995
CN      1318664 A     10/2001
(Continued)

OTHER PUBLICATIONS

English Translation of Japanese Office Action, Application No. 2011-533512 dated May 14, 2013.
(Continued)

*Primary Examiner* — Mandy Louie
(74) *Attorney, Agent, or Firm* — MacMillan, Sobanski & Todd, LLC (57) ABSTRACT

A process for preparing mist, which includes micro/nano solids or liquids, and a process for forming new materials by mist gas discharge, and also an apparatus for forming new materials. The advantages are: as compared to common gases, mists exhibit broader selection range of elements and compounds and broader range of suitable temperature and pressure. Due to the presence of mist Al(m), in a sealed container, the concentration of A in unit volume of mist is far higher than the concentration of A in unit volume of gas. Under specific conditions, the physical/chemical reactions can be carried out more easily, and new materials can be formed with higher efficiency.

4 Claims, 1 Drawing Sheet

(56) References Cited

U.S. PATENT DOCUMENTS

2005/0020038 A1* 1/2005 Mikhael et al. ............... 438/485
2006/0013964 A1   1/2006 Chu et al.
2006/0177598 A1* 8/2006 Ward ........................... 427/561
2008/0118734 A1   5/2008 Goodwin et al.

FOREIGN PATENT DOCUMENTS

| CN | 2720237 Y | 8/2005 |
| CN | 2761199 Y | 3/2006 |
| JP | 10330941 A | 12/1998 |
| JP | 2000097030 A | 4/2000 |
| JP | 2002305163 A | 10/2002 |
| JP | 2003245563 A | 9/2003 |
| JP | 2008501069 A | 1/2008 |

OTHER PUBLICATIONS

International Search Report, PCT/CN2009/001035, dated Dec. 24, 2009.
English Abstract of CN 1097221 (A).
English Abstract of JP 10330941 (A).
English Abstract of JP 2000097030 (A).
English Abstract of CN 1318664 (A).
English Abstract of CN 2720237 (Y).
European Search Report, Application No. PCT/CN2009001035, dated Jul. 11, 2013.
Hou et al., "Passivation of GaAs surface by sulfur glow discharge", American Institute of Physics, vol. 69, No. 10, pp. 1429-1431, Jun. 21, 1996.
Li et al., "Hybrid evaporation: Glow discharge source for plasma immersion ion implantation", American Institute of Physics, 2003, vol. 74, No. 10, pp. 4301-4304.
Kwok et al., "Biocompatibility of calcium and phosphorus doped diamond-like carbon thin films synthesized by plasma immersion ion implantation and deposition", Diamond and Related Materials, 2006, vol. 15, pp. 893-897.
English Translation of the Japanese Office Action, Application No. 2011-533512, dated Oct. 28, 2013.

* cited by examiner

PREPARATION OF MIST, PROCESS AND APPARATUS FOR FORMING NEW MATERIALS BY MIST GAS DISCHARGE

BACKGROUND OF THE INVENTION

The present invention relates to a process for forming new materials by gas discharge, in particular, the present invention relates to the preparation of mist, a process for forming new materials by mist gas discharge, an apparatus for generating mist, and power equipment.

In the year of 1835, Faraday discovered the phenomenon of gas discharging at a low pressure. Centennially, gas discharge has been widely applied in electric light source, laser, modification of metallic materials and polymeric materials, semiconductors, integrated circuit, and so on. These gas discharges are all simple gas discharges. Taking material industry as an example, plasma nitriding uses nitrogen, hydrogen gases (Zhang Guoqing, et al, Studies on low temperature plasma nitriding of 0Cr17Ni12Mo2 austenite stainless steel [J], Heat Treatment of Metals, 2008, 33(8) p. 138-141). Ion-plating techniques use argon (Zhang Jun, Zhao Yanhui, Techniques and Application of Multi-arc Ion Plating [M], Beijing Metallurgical Industry Press, 2007). Plasma texture modification employs air, oxygen, nitrogen, fluorine-containing gas, etc. (Chinese patent CN1318664.A). The discharge media are all gas. However, as compared to unitary gas, the present invention uses mist Al(m) which consists of a plurality of material forms, and has broader selection scope of elementary substances and/or compounds to carry out gas discharge, i.e., mist gas discharge. The mist gas discharge is used to form new materials.

SUMMARY OF THE INVENTION

In first aspect, the present invention provides a process for generating mist.

In secondary aspect, the present invention provides a process for forming new materials by mist gas discharge.

In another aspect, the present invention provides an apparatus for generating mist and power equipments, i.e., an apparatus for forming new materials by mist gas discharge.

As for the discharge in present invention, it is a mist gas discharge at a certain temperature and pressure in a mist which comprises micro/nano solid and liquid in an self-designed apparatus so as to form new materials.

In the first aspect, the prevent invention provides a process for generating mist. The process comprises the steps of:

1) providing a first container, the pressure and temperature in the container or a specific region of the container are settable;

2) providing a solid, liquid elementary substance or/and compound in a second container, the second container being placed inside or outside the first container;

3) altering the temperature or/and pressure in the second container to make the solid, liquid elementary substance or/and compound in the second container enter into the first container to generate mist, the mist being dispersed in the first container or a part of the first container.

In the second aspect, the present invention provides a process for forming new materials by mist gas discharge, the process comprises the steps of:

1) providing a device for forming new materials therein or a material to be modified, placing it in a first container;

2) introducing a pretreating gas, and generating spark or arc discharge, followed by glow discharge, the device or the material being pretreated by the glow discharge;

3) heating or cooling the device in the first container or the material to be treated to a designated temperature and holding at the temperature;

4) generating the mist of elementary substance or/and compound according to the process as described in the first aspect;

5) turning on power supply equipment, generating mist gas discharge between the two electrodes in the first container to form new materials in a specific device or the material is subjected to mist gas discharge modification in a designated pressure in the first container, e.g., 1.3 Pa-50 Pa.

In a preferred embodiment of the present invention, the device in the first container or the material to be modified is heated or cooled to a temperature between −210° C. and 1400° C., and is maintained at the temperature.

In a preferred embodiment of the present invention, the mist gas discharge is not limited to unitary mist gas discharge, and multiple mist gas discharges is carried out for many times is possible, for example, $$A(m)\text{discharge}+J(m)\text{discharge}+D(m)\text{discharge}+\ldots$$

wherein A(m), J(m), D(m) represent different mists, respectively.

In a preferred embodiment of the present invention, common gas discharges, PVD, CVD, sputtering etc. can be carried out alternatively with the mist gas discharge process according to the invention; For example, common gas discharges+J(m) discharge, etc.

In an alternative embodiment of the present invention, multiple mist gas discharges and multiple common gas discharges are carried out for many times, for example, $$A(m)\text{discharge}+\text{common gas discharge}+J(m)\text{discharge}+D(m)\text{discharge}+\text{another common gas discharge}+\ldots,$$

wherein A(m), J(m), D(m) represent different mists, respectively.

In the embodiments of the present invention, the materials to be modified may be elementary substances and compounds, include but are not limited to metals and alloys thereof, ceramics, glass, glass fibers, graphite, diamond, carbon fiber; polymers such as polyethylene, polyvinyl chloride, polytetrafluoroethylene, etc; natural fibers, such as cotton, hemp, wool, silk, wood, etc; synthetic fibers, such as viscose fiber, protein fiber, etc; artificial fibers, such as; polyurethane, polyester, aramid, nylon, etc; and plating layer, coating layer, diffusion layer, and composite layer of such materials.

The apparatus for carrying out the mist gas discharge process of the present invention mainly comprises following parts:

1) a first container comprising a pressure system to cause the container or a specific region of the container to reach a designated pressure;

2) a second container which is placed inside or outside the first container and filled with elementary substances or compounds, the second container comprising a second pressure system to cause the second container to reach a designated pressure;

3) one or more heating or cooling means for heating or cooling materials, elementary substances or/and compounds, altering the temperature of the containers or local regions to make the materials, elementary substances or/and compounds, containers or local regions to reach designated temperature;

4) electrodes or a cathode and an anode in the first container, the device for generating new materials therein or the materials to be treated being placed between the two electrodes or on the electrodes; a power supply for generating current and voltage, which can adjust the current and voltage to supply the two electrodes with current and voltage to generate mist gas discharge.

In the preferred embodiments of the present invention, the power supply can be direct current, direct current pulse, alternating current, microwave, radio frequency, high frequency, etc. power supplies.

In a preferred embodiment of the present invention, conventional PVD, CVD, sputtering, ion plating, etc. can be carried out in the apparatus of the present invention.

In another preferred embodiment of the present invention, the mist may consist of two or more elementary substances and/or compounds which are obtained at different times, i.e., it can have a composition of $AI_1(m)+AI_2(m)+AI_3(m)+\ldots$, wherein $AI_1(m), AI_2(m), AI_3(m)$, etc represent different compositions of mists, respectively.

Various aspects of this invention will become apparent to those skilled in the art from the following detailed description of the preferred embodiment, when read in light of the accompanying drawings.

DETAILED DESCRIPTION OF THE PREFERRED EMBODIMENT

Figure 1:
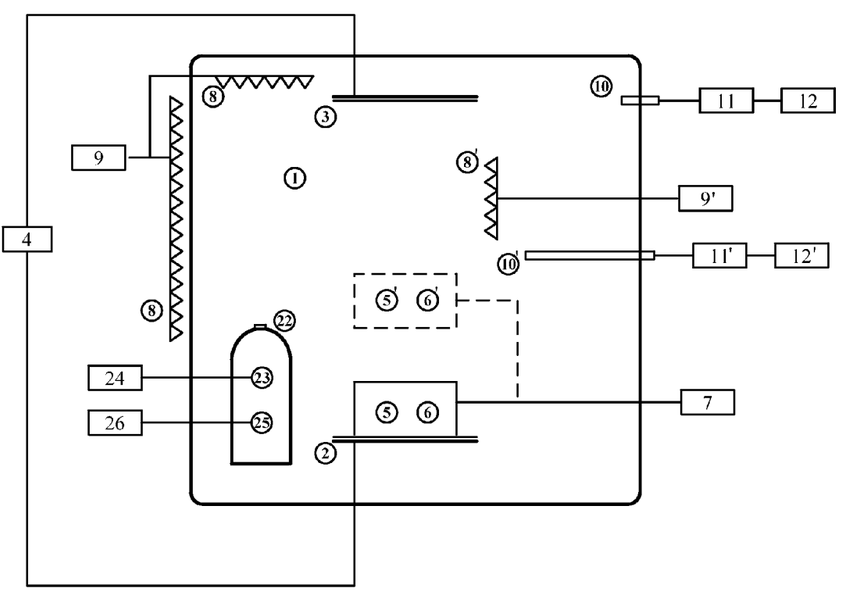
The sole FIGURE shows a schematic diagram of the apparatus for carrying out the mist gas discharge process of the present invention.

The mist gas discharge process of the present invention is described in detail as follows:

A) In a first container (1) there are arranged electrodes or cathode and anode. A specific device (5) is placed on the electrodes or between the electrodes, and new materials to be formed therein or the material C to be modified is placed therein. A means (6) for heating or cooling is arranged therein. Temperature is controlled by using a material temperature measuring and controlling system (7) (hereinafter referred to as material temperature system), which can cause the material C to reach a designated temperature and maintain at the temperature.

B) Solid, liquid elementary substance or/and compound A: which is placed in a second container (22) arranged inside or outside the first container (1). When the two containers are communicated, the pressure at the outlet of the container (22) is identical to the pressure in the first container (1). To make A arrive at and maintain at the designated temperature, the temperature measurement and control by the heating or cooling means (23) is undertaken by a compound system (24) (hereinafter referred to as compound temperature system); to maintain the second container at designated pressure, a pressure control system (26) consisting of compression, evacuating means (25), auto-control instruments and valves is provided (hereinafter referred to as compound pressure system).

C) In the first container (1) there is a pressure control system (12) consisting of aeration, compression, evacuating means (11), auto-control instruments and valves (hereinafter referred to as container pressure system), which causes the whole container to reach and maintain at a designated pressure.

And there is a pressure control system (12') consisting of aeration, compression, evacuating means (11'), auto-control instruments and valves (hereinafter referred to as regional pressure system), which causes a region of the container to reach and maintain at the designated pressure.

D) Inside or outside the first container there are arranged heating or cooling means (8), temperature measuring and controlling system (9) (hereinafter referred to as container temperature system) to cause the container reach and maintain at the designated temperature.

And there are arranged heating or cooling means (8'), and temperature measuring and controlling system (9') (hereinafter referred to as regional temperature system) to cause a region reach and maintain at the designated temperature.

E) In the first container (1) there is a gas inlet (10), through which a specified quantity of gas enters the container. When the elementary substance or/and compound A is placed outside the low pressure container, it can also enter the container through the inlet.

F) The pressure control system (12) of evacuating means (11) is activated to make the pressure in the sealed container become a negative pressure.

When the pressure in the sealed container reaches the minimum, the aeration system (11) is activated, and pre-treating gas is introduced through gas inlet (10).

G) In the first container (1) there are a cathode (2), an anode (3), or two electrodes (2') and (3'); a power supply (4) is arranged between the electrodes for generating electric current and voltage. The power supply is any one of direct current, direct current pulse, alternating current, microwave, radio frequency, high frequency, etc.; power system (4) is used for supplying power, as well as for measuring and controlling the voltage and current.

H) The material temperature system (6) (7) is activated to make the specific device or the material C to be modified to reach and maintain at a certain temperature.

I) A power supply system (4) is activated to generate glow discharge between the electrodes to pretreat the specific device or the surface of the material C to be modified at designated pressure of the container, such as 1.3 Pa-50 Pa.

J) The material temperature system (6) (7) is activated, and the heat effect of glow discharge causes the temperature of the specific device or material C to be modified increasing continuously to the designated temperature according to the technological requirements.

K) Mist Al(m) is obtained by mist formation process. The process comprises:

[1] As to elementary substance and/or compound A, when saturated vapor pressure at a temperature $T_0$ is $P_0$; when the temperature $T_0$ is unchanged while the pressure in the container is less than $P_0$, or when $P_0$ is unchanged while the temperature in the container is more than $T_0$, A is in gas state.

The container temperature system (8) (9) is activated to maintain the temperature T of the first container at $T_0$; a container pressure system (11) (12) is activated to maintain the pressure P of the first container at $P_0$.

The activating means (23) i.e. the power supply and the temperature measuring and controlling compound system (24) are activated to make the temperature of the elementary substance or/and compound A in the second container (22) exceed $T_0$; since the pressure in the first container is identical to the pressure at outlet of the container (22), i.e., maintaining at $P_0$, A is gasified and enters into the container. Then, the pressure in the first container is increased, and the pressure system causes the pressure of sealed container to maintain at the designated pressure. The pretreating gas decreases gradually, and only A gas or trace of pretreating gas is remained in the first container. Or a part of pretreating gas is remained according to practical requirements.

(a) In the first container, the container temperature system (8) (9) is activated to maintain the temperature T of the container at $T_0$; the container pressure control system (11) (12) is activated to make the pressure P of the container greater than $P_0$, a part of gas A is converted into micro/nano liquid A or solid A; the micro/nano liquid A or solid A is suspended in the gas A to form mist A(m);

i.e., when $T=T_0$, and $P>P_0, A(g) \to A(s,l)+A(g) \to A(m)$.

(b) In the first container, the container temperature system (8) (9) is activated to maintain the temperature T of the container at $T_0$, the regional pressure control system (11') (12') are activated to make the pressure P of some part of the container more than $P_0$, some gas A is converted into micro/nano liquid A or solid A; the micro/nano liquid A or solid A is suspended in the gas A to form mist A(m);

i.e., when $T=T_0$, and $P>P_0, A(g) \to A(s,l)+A(g) \to A(m)$.

(c) In the first container, the container pressure control system (11) (12) is activated to maintain the pressure P of the container at $P_0$, the container temperature system (8) (9) is activated to make the temperature T in the container less than $T_0$; some gas A is converted into micro/nano liquid A or solid A; the micro/nano liquid A or solid A is suspended in the gas A to form mist A(m);

i.e., when $P=P_0$, and $T<T_0, A(g) \to A(s,l)+A(g) \to A(m)$.

(d) In the first container, the container pressure control system (11) (12) is activated to maintain the pressure P of the container at $P_0$, the regional temperature system (8') (9') is activated, or due to a rapid heat dissipation, e.g., a low temperature region is formed near the furnace wall to make the temperature T of some part within the container less than $T_0$; some gas A is converted into micro/nano liquid A or solid A; the micro/nano liquid A or solid A is suspended in the gas A to form mist A(m);

i.e., when $P=P_0$, and $T<T_0, A(g) \to A(s,l)+A(g) \to A(m)$.

When there is a gas H which does not chemically react with A in the container, mist I(m) is formed;

i.e., $A(m)+H(g) \to I(m)$;

[2] If there is pretreating gas or gas H(g) in the first container (1), and the temperature is less than $T_0$, in the second container (22), the compound temperature system (23)(24) is activated to increase the temperature of A greater than $T_0$ to gasify A.

However, the temperature in the first container (1) is less than $T_0$; and after A gas enters into the first container (1), some gas A is converted into micro/nano liquid A or solid A, i.e., becomes mist A(m); the concentration of mist A(m) in the sealed container is increased gradually; then the pressure in the first container (1) is increased.

The container pressure system (11) (12) is activated to maintain the pressure of the container at a designated pressure P; gas H(g) is decreased gradually and approaches zero when the saturated vapor pressure of A is large enough; only mist A(m) is present in the first container (1).

Generally H(g) presents at a certain ratio;

i.e., in the container $A(m)+H(g) \to I(m)$.

[3] In the first container there is mist A(m), the elementary or/and compound E is converted into micro/nano solid or liquid by physical processes such as gas discharge sputtering, magnetron sputtering, ion injection, etc. Or micro/nano solid or liquid is directly introduced.

E(s, l) is suspended in A(m) to form mist F(m), i.e., $A(m)+E(s,l) \to F(m)$;

When there is a gas H which does not chemically react with A in the container, mist J(m) is formed;

i.e., $F(m)+H(g) \to J(m)$.

[4] In the first container there are mist elementary substance or/and compound A(m) or A(g), mist elementary substance or/and compound B(m) or B(g). A and B react chemically to form micro/nano solid or liquid M(s, l), gas N(g).

i.e., $A(m)+B(m) \to M(s,l)+N(g) \to C(m)$ $A(m)+B(g) \to M(s,l)+N(g) \to C(m)$ $A(g)+B(m) \to M(s,l)+N(g) \to C(m)$

Mist C(m) is a reaction product, and can also consist of the reaction product and residual A or B after the reaction.

When there is a gas H which does not chemically react with A, B in the container, mist K(m) is formed;

i.e., $C(m)+H(g) \to K(m)$.

[5] In the first container, mist elementary substance or/and compound A(m) is decomposed to form micro/nano mist solid or liquid M(s, l), gas N(g).

i.e., $A(m) \to M(s,l)+N(g) \to D(m)$

Mist D(m) is a reaction product, and can also consist of the reaction product and residual A after the reaction.

When there is a gas H which does not chemically react with A in the container, mist L(m) is formed;

i.e., $D(m)+H(g) \to L(m)$.

[6] In the first container, according to the formation conditions in [1], [2], [3], [4] and [5], the formed mists A(m) B(m) C(m) D(m) I(m) J(m) K(m) L(m) are collectively referred to as AI(m), which is mist consisting of two or more elementary substances and/or compounds obtained by one operation or several operation s at different times, i.e., the composition thereof may be $AI_1(m)+AI_2(m)+AI_3(m)+\ldots$.

The mist AI(m) is characterized in that: since micro/nano solid, liquid are suspended in the gas, the mist AI(m) has low transparency; under the conditions of same voltage, electric current, gas pressure, and temperature, the morphology of glow discharge is different from that of general gas discharge.

L) Compound temperature system (23) (24) and compound pressure system (25) (26) are activated to make the elementary substances or/and compounds in the first container reach designated amount according to technological processes.

M) In the mist AI(m) generated as above, power supply system (4) is activated, a voltage is generated between the two electrodes or between the cathode and the anode. Under action of electric field, mist gas discharge is generated between the electrodes.

N) (6) (7) (8) (9) (11) (12) are activated, and pressure and temperature are adjusted, and the voltage and electric current between the two electrodes of power supply system (4) are activated. Under the thermal effect generated by mist gas discharge, the temperature of the specific device (5) or the material C to be modified is increased continuously to a designated temperature according to technological requirements, mist gas discharge is maintained for a certain time (depending on technological requirements).

New materials are obtained under physical/chemical action of mist gas discharge. As an alternative, the material C to be modified obtains different physical/chemical properties and becomes a new material.

Mist gas discharge is not limited to unitary mist discharge, but multiple mist discharges for many times, for example, $A(m)$discharge+$J(m)$discharge+$D(m)$discharge+ . . .

Mist gas discharge and common gas discharges, PVD, CVD, sputtering can be carried out alternatively with the process according to the invention, e.g., common gas discharges+$J(m)$ discharge.

Multiple mist gas discharges and multiple common gas discharges are carried out many times, for example, $A(m)$discharge+common gas discharge+$J(m)$discharge+$D(m)$discharge+another common gas discharge+ . . . , Common PVD, CVD, sputtering and ion plating can be carried out in the apparatus according to the invention.

The material C may be an elementary substance or compound, including but not limit to metals and alloys thereof, ceramics, glass, glass fibers, graphite, diamond, carbon fiber; polymers such as polyethylene, polyvinyl chloride, polytetrafluoroethylene, etc; natural fibers, such as cotton, hemp, wool, silk, wood, etc; synthetic fibers, such as viscose fiber, protein fiber, etc; artificial fibers, such as; polyurethane, polyester, aramid, nylon, etc; and plating layer, coating layer, diffusion layer, and composite layer of such materials.

The advantages of the present invention are: due to the presence of mist AI(m), in sealed container, the concentration of A in unit volume of mist is far more higher than the concentration of A in unit volume of gas; under specific conditions, physical/chemical reaction can be carried out more easily, and new materials can be formed and have higher efficiency.

As compared with a unitary gas, mist AI(m) consists of a plurality of material forms, and the elementary substances and compounds can be selected from a broader scope.

Further, when mist forms, P is unchanged, $T<T_0$; T is unchanged, $P>P_0$, mist gas discharge can be carried out at lower temperature or higher pressure than those of a common gas discharge.

EXAMPLES

The invention is further described through specific examples hereinafter. The examples are used only to illustrate the invention and not intended to limit the invention.

Example 1

Aluminized layer being formed on the surface of metal materials by mist $AlCl_3$ gas The mist $A(m)$:$AlCl_3$, $T_0$=96.7° C., saturated vapor pressure $P_0$=133 Pa.

Modified material C: mold steel H13

A) In the first container (1), a specific device (5) was placed on the cathode, in which the material to be modified, i.e. the mold steel H13, was placed inside of the first container (1). Heating or cooling means (6) was used, and the temperature was controlled by a material temperature measuring and controlling system (7) (hereinafter referred to as material temperature system). The material C: mold steel H13 was heated and held at designated temperature $T_1$.

B) Solid compound $AlCl_3$ was placed in the second container (22) which is arranged inside or outside of the first container (1). To make $AlCl_3$ reach and maintain at designated temperature $T_4$, heating or cooling means (23) was used, and power supply and temperature measuring and controlling were undertaken by a compound system (24) (hereinafter referred to as compound temperature system). To maintain the second container at designated pressure, a pressure control system (26) consisting of compression, evacuating means (25), auto-control instruments and valves is provided (hereinafter referred to as compound pressure system).

C) In the first container (1) there was a pressure control system (12) consisting of aerating and evacuating means (11), auto-control instruments and valves (hereinafter referred to as container pressure system) to make the entire container reach and maintain at designated pressure.

And there was a pressure control system (12') consisting of aerating and evacuating means (11') auto-control instruments and valves (hereinafter referred to as regional pressure system), which caused some region of the container to reach and maintain at the designated pressure.

D) Inside or outside the first container there were arranged heating or cooling means (8), and temperature measuring and controlling system (9) (hereinafter referred to as container temperature system) to cause the container reach and maintain at the designated temperature.

And there were arranged heating or cooling means (8') and temperature measuring and controlling system (9') at a region (hereinafter referred to as regional temperature system) to cause the region reach and maintain at the designated temperature.

E) In the first container (1) there was a gas inlet (10), through which the designated gas is introduced into the container.

F) The pressure control system (12) and evacuating means (11) were activated to form a negative pressure in the sealed container.

When the pressure in the sealed container reached 1.3 Pa, the container pressure control system (11) (12) was activated, and pretreating Ar gas was introduced through the gas inlet (10).

G) In the first container (1), there were arranged a cathode (2) and an anode (3), 0-1500V adjustable direct current or pulse high voltage was provided between the cathode and anode through high voltage power supply system (4), and the voltage and current were measured and controlled.

H) Power supply system (4) was activated, glow discharge was generated between the electrodes, under the designated pressure in the container, e.g., 1.3 Pa-50 Pa, the surface of the material C to be modified: mold steel H13 was subjected to pretreatment.

I) The container pressure control system (11)(12) was activated to make the pressure in the container reach 133 Pa.

J) $AlCl_3$ mist AI(m) was obtained by mist formation process. The process comprises:

The container temperature system (8) (9) was activated to make the temperature of the first container reach 100° C.

The compound temperature control system (23)(24) was activated to make the temperature of A:$AlCl_3$ placed in the second container (22) reach 120° C., more than $T_0$. Since the pressure at outlet of the container (22) was equal to that of the first container, the pressure reached 133 Pa, which is equal to $P_0$, A:$AlCl_3$ gasified and entered into the first container (1). Then, the pressure in the container was increased.

The container pressure control system (11)(12) was activated to make the pressure in the sealed container maintain at 133 Pa. The pretreating gas was decreased gradually and approached zero; there was only $AlCl_3$ gas in the first container.

(a) The container temperature system (8') (9') was activated to make the temperature around the material C in the first container or the temperature of the case of the first container reach 80° C., less than $T_0$, some gas A was transformed into micro/nano liquid A or solid A, which are suspended in gas A and form mist A(m).

i.e., when $P=P_0$, and $T<T_0, A(g) \rightarrow A(s,l)+A(g) \rightarrow A(m)$.

(b) Alternatively, when the temperature of the first container was maintained at 100° C., the compound temperature control system (23)(24) was activated to make the temperature of $AlCl_3$ in the second container (22) reach 120° C., more than $T_0$; since the pressure at outlet of the container (22) was equal to that of the first container (1), the pressure reached 133 Pa, which is equal to $P_0$, $AlCl_3$ gasified and entered the first container (1). The pressure in the container was increased, then the regional pressure system (11')(12') at the inlet (10') of the container and the compound pressure system (25) (26) were activated to maintain the pressure of the region at 150 Pa, which is more than $P_0$. Some gas A was transformed into micro/nano liquid A or solid A, which was suspended in the gas A to form mist A(m);

i.e., when $T=T_0$, and $P<P_0, A(g) \rightarrow A(s,l)+A(g) \rightarrow A(m)$.

K) The compound temperature system (23) (24) and compound pressure system (25) (26), and container temperature system (8)(9), container pressure system (11)(12) were activated to maintain the compound $AlCl_3$ in the first container at a certain quantity according to the technological process.

L) High voltage power supply system (4) was activated to provide a voltage of 350-1500 V, which may be adjusted according to the requirements of the diffusion layer of mold steel. Under the action of electric field, mist spark and arc discharge were generated between the electrodes for several minutes or tens of minutes.

M) (6) (7) (8) (9) (11) (12) were utilized to adjust the temperature and pressure; power supply system (4) were activated to generate voltage and electric current between the two electrodes, mist spark and arc discharge were converted into mist gas glow discharge. Under the thermal effect of glow discharge, the temperature of mold steel C was increase continuously to designated temperature $T_1$ according to the requirements of mold steel diffusion layer, e.g., 550° C.

N) Under the action of mist gas discharge, mist $AlCl_3$ was decomposed at 550° C. near mold steel: $2AlCl_3$-$2Al+3Cl_2$, and became mist D(m). Mist gas discharge was held for 2 hours (depending on the requirements of steel diffusion layer).

Under physical/chemical action of mist gas discharge, Fe—Al solid solutions $Fe_2Al_5$, $Fe_3Al$, FeAl, $FeAl_2$, $FeAl_3$ and the like were formed on the surface of the mold steel (5).

According to the processes as described above, various steels, and various metals Ni, Cr, Ti, Cu, Mo, Nb, W, Mg, etc and alloys thereof were placed on the cathode, and various layers of alloys and compounds of Al were formed on the surface.

Example 2

Nitride diffusion layers were formed on the surface of metal materials by mist ammonium chloride gas discharge Mist A(m): $NH_4Cl$, $T_0$=162° C., saturated vapor pressure $P_0$=133 Pa.

Modified material C:35CrMo nitrided steel.

The equipments employed in the example were as described in Example 1.

A) The material to be modified, i.e. 35CrMo nitrided steel, was placed in the specific device (5) on the cathode.

B) Solid compound $NH_4Cl$ was placed in the second container (22), which was placed inside or outside of the first container (1).

C) The container pressure control system (11)(12) was activated to form negative pressure in the first container.

D) When the pressure in the first container reached 1.3 Pa, the control system (11)(12) was activated, and pretreating gas $N_2$ was introduced via gas inlet (10).

E) Power supply system (4) was activated, and 0-1500V adjustable direct current or pulse high voltage was generated. Spark and arc discharge were generated between the electrodes, and then was converted to glow discharge. The surface of the material C:35CrMo nitrided steel was subjected to pretreatment under the designated pressure in the container, such as 1.3 Pa-50 Pa.

F) After the material C 35CrMo was pretreated, the container pressure system (11)(12) was activated to make the pressure in the first container reach 50 Pa.

G) Mist was formed:

Temperature increasing and decreasing system and temperature control system (8)(9) was activated to maintain the temperature T of the first container (1) at 170° C.

Since the pressure at outlet of the second container (22) and the pressure in the first container (1) had reached 50 Pa, the compound temperature system (23)(24) was activated to make the temperature of A: solid $NH_4Cl$ in the second container (22) exceed 190° C., A gasified and entered into the first container. The concentration of gas compound $NH_4Cl$ in the first container was increased gradually; then, the pressure in the first container was increased.

The container pressure control system (11)(12) was activated to maintain the pressure in the first container at 133 Pa; inert gas was decreased gradually and reached a certain ratio according to the requirements of the diffusion layer, such as 40%. There were $NH_4Cl$ and $N_2$ in the first container (1).

The regional temperature system (8')(9') was activated to make the temperature around the material C or the temperature of the case of the first container being 120° C., which is less than $T_0$. Some gas A:$NH_4Cl$ was transformed into micro/nano liquid or solid, which was suspended in the gas A to form mist A(m); or temperature system (8)(9) was activated to make the temperature of the first container less than $T_0$ to form mist gas A(m).

H) The compound temperature system (23) (24) and compound pressure system (25) (26), and container temperature system (8)(9), and container pressure system (11)(12) were activated to maintain the compound $NH_4Cl$ in the first container at a designated quantity.

I) High voltage power supply system (4) was activated to generate a voltage of 350-1500 V, which was adjusted according to the requirements of diffusion layer of 35CrMo steel. Under the action of electric field, mist spark and arc discharge were generated between the electrodes for several minutes or tens of minutes.

J) (6) (7) (8) (9) (11) (12) were utilized to adjust the temperature and pressure; power supply system (4) were activated to generate a voltage and electric current between the two electrodes, mist spark and arc discharge were converted into mist gas glow discharge. The temperature of 35CrMo steel C was increased continuously to designated temperature according to the requirements of the mold steel diffusion layer, e.g., 550° C.

K) Under the action of mist gas discharge, mist $NH_4Cl$ was decomposed around the mold steel: $2NH_4Cl \rightarrow N_2 \rightarrow 3H_2 +$ 2HCl. Mist gas discharge was held for 4 hours (depending on the requirements of the steel diffusion layer).

Under physical/chemical action of mist gas discharge, diffusion layers such as $Fe_4N$, $Fe_2N$, etc. were formed on the surface of 35CrMo nitrided steel. The thickness was increased more than 20%, as compared to a conventional nitriding.

According to the processes as described above, various steels, and various metals Ni, Cr, Ti, Cu, Al, Mg, W, Mo, etc and alloys thereof were placed on the cathode, and a layer of nitrogen compounds was formed on the surface.

Example 3

Forming a sulphurized layer or a sulfur and sulfide composite layer on the surface of metal materials by mist sulfur gas discharge Mist A(m): elemental sulfur, $T_0$=144.5° C., saturated vapor pressure $P_0$=13.3 Pa.

Modified material C: bearing steel GCr15.

The equipments employed in this Example were as described in Example 1.

A) The material to be modified, i.e. the GCr15 steel, was placed in the specific device (5) on the cathode.

B) Solid elemental sulfur was placed in the second container (22), which was placed inside or outside of the first container (1).

C) The evacuating means (11) and pressure control system (12) were activated to form a negative pressure in the first container.

D) When the pressure in the first container reached 1.3 Pa, the aeration system (11) was activated, and pretreating gas $NH_3$ was introduced via gas inlet (10).

E) Power supply system (4) was activated, and 0-1500V adjustable direct current or pulse high voltage was generated. Spark and arc discharge was generated between the electrodes, and then was converted to glow discharge. The surface of the material GCr15 steel was subjected to pretreatment under designated pressure in the container, such as 1.3 Pa-50 Pa.

F) After the material GCr15 was pretreated, the container pressure system (11)(12) was activated to make the pressure in the first container reach 1.3 Pa.

G) Mist was formed:

The container temperature system (8)(9) was activated to maintain the temperature T of the first container (1) at 90° C.

Since the pressure at outlet of the second container (22) and the pressure in the first container (1) reached 1.3 Pa, the compound temperature system (23)(24) was activated to make the temperature of A: elementary sulfur in the second container (22) exceeding 190° C., A gasified and entered into the first container.

Since the temperature of the first container (1) was less than $T_0$, after gas sulfur entered into the first container (1), partial sulfur became micro/nano liquid and/or solid, i.e., mist sulfur A(m). The concentration of mist sulfur in the sealed container was increased gradually. Then, the pressure in the first container was increased.

The container pressure control system (11)(12) was activated to maintain the pressure in the first container at 13.3 Pa; $NH_3$ gas was decreased gradually; mist sulfur AI(m) in the low pressure container was increased.

H) The compound temperature system (23) (24) and compound pressure system (25) (26), and container temperature system (8)(9), and container pressure system (11)(12) were activated to maintain the elementary sulfur in the first container at a designated quantity.

I) High voltage power supply system (4) was activated to generate a voltage of 350-1500 V, which was adjusted according to the requirements of the properties of GCr15 steel.

Under the action of electric field, mist spark and arc discharge were generated between the electrodes for several minutes or tens of minutes.

J) (6) (7) (8) (9) (11) (12) were utilized to adjust the temperature and pressure; power supply system (4) were utilized to adjust the voltage and electric current between the two electrodes, so as to convert mist spark and arc discharge into mist gas glow discharge. The temperature of GCr15 steel C was increased continuously to a designated temperature $T_1$ according to the requirements of GCr15 steel diffusion layer, e.g., 140° C. Mist gas discharge was held for 2 hours (depending on the requirements of steel diffusion layer).

K) The compound temperature system (23)(24) was activated to increase the temperature of sulfur rapidly to 300° C., a great amount of mist sulfur entered into the first container and the pressure therein was increased.

L) The container pressure control system (11) (12) and compound temperature system (23)(24) were activated to maintain the pressure at 500 Pa.

M) Micro/nano Mo (or produced by sputtering, etc.) was introduced into the first container 2S+Mo→$MoS_2$ or $MoS_2$ was directly introduced to form mist J(m).

N) Power supply system (4), compound temperature system (23)(24), container temperature system (8)(9), regional temperature system (8')(9'), and material temperature system (6)(7) were employed to maintain the temperature of bearing steel at 140° C. and hold for 10-50 minutes.

O) Power supply (4) and heating system (8)(9) were turned off.

P) When the pressure in the first container reached 2000 Pa (depending on the thickness of composite layer), the compound heating system (24)(23) was turned off.

Thereby, under the physical/chemical action of mist gas discharge, Fe—S solid solution and compounds such as FeS, $FeS_2$, etc. were formed on the surface of bearing steel (5), and a composite material of S+$MoS_2$ was formed thereon.

By the same process as described above, various steels, and various metals such as Ni, Ti, Cu, Mo, Nb, W, Mg, Al, and alloys thereof were placed on the cathode, a S solid solution, a compound layer and a composite material layer were formed on the surface.

Above the S compound, in addition to $MoS_2$, micro/nano solids or liquids such as $WS_2$, graphite, etc. can be also introduced to form corresponding composite materials.

If desired, the steps J, K, L, M, N, O can be omitted, then only Fe—S solid solution and compounds such as FeS, $FeS_2$ and the like were formed on the surface of bearing steel (5).

Example 4

Modification of chemical fibers by mist acrylic acid gas discharge

Mist A(m): liquid acrylic acid, $T_0$=39° C., saturated vapor pressure $P_0$=1330 Pa.

Modified material C: chemically synthetic polyester fiber.

The equipments employed in this Example were as described in Example 1.

A) The material polyester fiber to be modified was placed in the specific device (5') between the two electrodes.

B) Liquid compound A: liquid acrylic acid was placed outside the first container (1).

C) The container pressure control system (11) (12) was activated to form a negative pressure in the first container.

D) When the pressure in the first container reached 1.3 Pa, the aeration system (11) was activated, and pretreating gas air was introduced via gas inlet (10).

E) Power supply system (4) was activated, and 0-1500V adjustable direct current or pulse high voltage was generated. Spark and arc discharge was generated between the electrodes, and then was converted to glow discharge. The surface of the material polyester fiber was subjected to pretreatment under designated pressure in the container, such as 1.3 Pa-50 Pa.

F) After the material polyester fiber was pretreated, the container pressure system (11)(12) was activated to make the pressure in the first container reach 1.3 Pa.

G) Mist was formed:

The container temperature system (8)(9) was activated to maintain the temperature T of the first container (1) at 40° C.

Since the pressure at outlet of the second container (22) and the pressure in the first container (1) reached 1.3 Pa, the compound temperature system (23)(24) was activated to make the temperature of A: acrylic acid in the second container (22) exceeding 40° C., A gasified and entered into the container.

The concentration of gas acrylic acid in the first container was increased gradually; then, the pressure in the first container was increased.

The container pressure control system (11)(12) was activated to maintain the pressure in the first container at 600 Pa; air was decreased gradually and approaches zero; only acrylic acid is present in the first container (1).

The regional temperature system (8')(9') was activated to make the temperature T of a part of the first container (near the material C) less than 15° C.; some gas A: acrylic acid was transformed into micro/nano liquid or solid, which were suspended in gas A to form mist A(m).

H) The compound temperature system (23) (24) and compound pressure system (25) (26), and container temperature system (8)(9), and container pressure system (11)(12) were activated to maintain the acrylic acid in the first container at a designated quantity.

I) High voltage power supply system (4) was activated to generate a voltage of 350-1500 V. Under the action of electric field, mist spark and arc discharge were generated between the electrodes for several minutes or tens of minutes.

J) (6) (7) (8) (9) (11) (12) were utilized to adjust the temperature and pressure; power supply system (4) were utilized to adjust the voltage and electric current between the two electrodes, so as to convert mist spark and arc discharge into mist gas glow discharge. The temperature of polyester fiber C was increased continuously to a designated temperature 110° C. according to the requirements of polyester fibers. Mist gas discharge was held for 1 hour (depending on the requirements of polyester fibers). Under the physical/chemical action of mist gas discharge, hydrophilic oxygen-containing polar groups, such as —OH group, were grafted on the surface of the fibers.

By the same process as described above, synthetic fibers, natural fibers, glass fiber and products, carbon fibers and products, polyvinyl chloride, polytetrafluoroethylene, and similar polymers were placed between the cathode and anode, the surface modification was carried out using unsaturated organic acids or organic compounds containing double or triple bond as mist gas discharge reactants. The surface moisture absorption of modified synthetic fibers, polymers, glass fibers, carbon fibers was significantly improved.

In present Example, the power supply (4) may be radio frequency, microwave, alternating current, high frequency power.

Example 5

Surface modification of plastics and rubber by mist sulfur gas discharge

Mist A(m): elemental sulfur, $T_0$=144.5° C., saturated vapor pressure $P_0$=13.3 Pa.

Modified material C: polyvinyl chloride

The equipments employed in the example were as described in Example 1.

A) The material polyvinyl chloride to be modified was placed in the specific device (5') between the two electrodes.

B) Solid elemental sulfur was placed inside or outside the first container (1).

C) The container pressure control system (11) (12) was activated to form a negative pressure in the first container.

D) When the pressure in the first container reached 1.3 Pa, the aeration system (11) was activated, and pretreating gas $NH_3$ was introduced via gas inlet (10).

E) Power supply system (4) was activated, and 0-1500V adjustable direct current or pulse high voltage was generated. Spark and arc discharge was generated between the electrodes, and then was converted to glow discharge. The surface of the material C: polyvinyl chloride was subjected to pretreatment under designated pressure in the container, such as 1.3 Pa-50 Pa.

F) After the material polyvinyl chloride was pretreated, the container pressure system (11)(12) was activated to make the pressure in the first container reach 1.3 Pa.

G) Mist was formed:

The container temperature system (8)(9) was activated to maintain the temperature T of the first container (1) at 40° C.

Since the pressure at outlet of the second container (22) and the pressure in the first container (1) reached 1.3 Pa, the temperature control system (23)(24) was activated to make the temperature of A: elementary sulfur in the second container (22) exceeding 200° C., A gasified and entered into the container. Since the temperature of the first container (1) was less than $T_0$, gas sulfur became mist A(m) immediately after entering into the first container (1), the concentration of mist sulfur in the sealed container was increased gradually; then, the pressure in the first container (1) was increased.

The container pressure control system (11)(12) was activated to maintain the pressure of the container at 133 Pa; gas $NH_3$ was decreased gradually; mist sulfur was increased gradually in the first container (1).

H) The compound temperature system (23) (24) and compound pressure system (25) (26), and container temperature system (8)(9), and container pressure system (11)(12) were activated to maintain the acrylic acid in the first container at a designated quantity.

I) High voltage power supply system (4) was activated to generate a voltage of 350-1500 V, which can be adjusted based on the requirements of polyvinyl chloride properties. Under the action of electric field, mist spark and arc discharge were generated between the electrodes for several minutes or tens of minutes.

J) (6) (7) (8) (9) (11) (12) were utilized to adjust the temperature and pressure; power supply system (4) was utilized to adjust the voltage and electric current between the two electrodes, so as to convert mist spark and arc discharge into mist gas glow discharge. The temperature of polyvinyl chloride was increased continuously to a designated temperature $T_1$, such as 80° C., according to the requirements of polyvinyl chloride. Mist gas discharge was held for 2 hours (depending on the requirements of polyvinyl chloride properties).

Under the physical/chemical action of mist gas discharge, the electric resistance of surface modified polyvinyl chloride was significantly increased. The volume resistivity at 20° C. was increased from $1 \times 10^{13}$ Ω·cm to $4 \times 10^{14}$ Ω·cm, and the toughness was increased.

By the same process as described above, polyethylene, polypropylene and rubbers were placed between the cathode and anode and surface modified using elementary sulfur as mist gas discharge reactant, with improved properties obtained.

In the example, the power supply (4) may be radio frequency, microwave, alternating current, high frequency power.

Example 6

Making silk have antibacterial properties by mist gas discharge

Mist gas A(m): elemental iodine, $T_0=43.7°$ C., saturated vapor pressure $P_0=133$ Pa.

Modified material C: silk fiber

The equipments employed in the example were as described in Example 1.

A) The material to be modified, i.e. silk fibers, was placed in the specific device (5) between the two electrodes.

B) Solid elemental iodine was placed outside the first container (1).

C) The container pressure control system (11) (12) was activated to make the pressure in the first container reach 133 Pa.

D) Mist was formed.

The container temperature system (8)(9) was activated to maintain the temperature T of the first container (1) at 20° C.

The compound temperature system (23)(24) was activated to make the temperature of A: elementary substance iodine in the second container (22) exceeding 60° C. The pressure in the container reached 1.3 Pa. Solid iodine gasified and entered into the container. Since the temperature of the first container (1) was less than $T_0$, iodine gas became mist A(m) immediately after entering into the first container (1), the concentration of mist iodine in the first container was increased gradually; then, the pressure in the first container was increased.

The container pressure control system (11)(12) was activated to maintain the pressure of the container at 133 Pa; air in the container was decreased gradually.

E) The compound temperature system (23) (24) and compound pressure system (25) (26) were utilized to maintain the elementary substance iodine in the first container at a designated quantity.

F) High voltage power supply system (4) was activated to provide a voltage of 350-1500 V, which can be adjusted according to the requirements of technological process. Under the action of electric field, mist spark and arc discharge were generated between the electrodes for several minutes or tens of minutes.

G) (6) (7) (8) (9) (11) (12) were utilized to adjust temperature and pressure; power supply system (4) was utilized to adjust the voltage and electric current between the two electrodes, so as to convert mist spark and arc discharge into mist gas glow discharge. The temperature of silk fiber was increased continuously to designated temperature 100° C., according to the requirements of silk properties. Mist gas discharge was held for 0.5 hours (depending on the requirements of silk properties).

Under the physical/chemical action of mist gas discharge, the surface modified silk fiber products exhibit significant inhibition to *staphylococcus* and *Escherichia Coli*.

By the same process as described above, other synthetic fibers and natural fibers were surface modified and similar effects were obtained.

In this example, the power supply (4) may be radio frequency, microwave, alternating current, high frequency power.

Example 7

Forming a titanizing layer on the surface of metal materials by mist gas discharge Mist A(m): $TiCl_3$, $T_0=531°$ C., saturated vapor pressure $P_0=133$ Pa.

Modified material C: high speed steel W18Cr4V

The equipments employed in the example were as described in Example 1.

A) The material to be modified, i.e. the high speed steel W18Cr4V, was placed in the specific device (5) on the cathode.

B) Solid compound $TiCl_3$ was placed inside or outside the first container (1).

C) The container pressure control system (11) (12) was activated to form a negative pressure in the first container.

D) When the pressure in the first container reached 1.3 Pa, the aeration system (11) was activated, and pretreating gas Ar was introduced via gas inlet (10).

E) Power supply system (4) was activated, and 0-1500 V adjustable direct current or pulse high voltage was generated. Spark and arc discharge was generated between the electrodes, and then was converted to glow discharge. The surface of the material C: high speed steel W18Cr4V was subjected to pretreatment under designated pressure in the container, such as 1.3 Pa-50 Pa.

F) After the material high speed steel W18Cr4V was pretreated, the container pressure control system (11)(12) was activated to make the pressure in the first container reach 1.3 Pa.

G) Mist was formed:

The container temperature system (8)(9) was activated to maintain the temperature T of the first container (1) at 450° C.

Since the pressure at outlet of the second container (22) and the pressure in the first container (1) reached 1.3 Pa, the compound temperature system (23)(24) was activated to make the temperature of A: $TiCl_3$ in the second container (22) exceeding 560° C. A gasified and entered into the container.

The concentration of gas compound $TiCl_3$ in the first container was increased gradually; then, the pressure in the first container was increased. The container pressure control system (11)(12) was activated to maintain the pressure in the container at 133 Pa; inert gas in the container was decreased gradually, gas Ar was decreased gradually and approached zero; there was only $TiCl_3$ in the first container (1).

The regional temperature system (8')(9') was activated to make the temperature T of a part (near the case of the container) in the first container less than $T_0$ such as 400° C.; some gas A: $TiCl_3$ was converted into liquid or solid, which was suspended in gas A to form mist A(m); or the temperature control system (8)(9) was activated to make the temperature in the first container less than $T_0$ to form mist A(m).

H) The compound temperature system (23) (24) and compound pressure system (25) (26) were activated to maintain the compound $TiCl_3$ in the first container at a designated quantity.

I) High voltage power supply system (4) was activated to generate a voltage of 350-1500 V, which was adjusted according to the requirements of diffusion layer of the high speed steel. Under the action of electric field, mist spark and arc discharge were generated between the electrodes for several minutes or tens of minutes.

J) (6) (7) (8) (9) (11) (12) were utilized to adjust the temperature and pressure; power supply system (4) were utilized to adjust the voltage and electric current between the two electrodes, so as to convert mist spark and arc discharge into mist gas glow discharge. The temperature of the high speed steel C was increased continuously to designated temperature $T_1$, such as 560° C., according to the requirements of the diffusion layer of the steel.

K) Under the action of mist gas discharge, mist $TiCl_3$ was decomposed at 560° C. around the steel: $2TiCl_3 \rightarrow 2Ti+3Cl_2$. Mist gas discharge was held for 4 hours (depending on the requirements of the diffusion layer of the steel).

$TiCl_4$ can also be used as a reactant, under high temperature gas discharge,

Under the physical/chemical action of mist gas discharge, diffusion layers such as $Fe_2Ti$, $FeTi$, $TiC$ were formed on the surface of high speed steel (5). By using the same process as described above and different technological processes, various steels, and various metals such as Ni, Cu, Mo, Nb, Al, Co and alloys thereof were placed on the cathode, and Ti solid solutions and compound diffusion layers were formed on the surface.

Example 8

First aluminizing and then nitriding on the surface of metals by mist gas discharge Mist A(m): $AlCl_3$, $T_0=96.7°$ C., saturated vapor pressure $P_0=133$ Pa.

Modified material C: mold steel H13

The equipments employed in the example were as described in Example 1.

A) The material to be modified, i.e. H13 steel, was placed in the specific device (5) on the cathode.

B) Solid compound $AlCl_3$ was placed inside or outside the first container (1).

C) The first container pressure control system (11) (12) was activated to form a negative pressure in the first container.

D) When the pressure in the first container reached 1.3 Pa, the aeration system (11) was activated, and pretreating gas Ar was introduced via gas inlet (10).

E) Power supply system (4) was activated, and 0-1500V adjustable direct current or pulse high voltage was generated. Spark and arc discharge was generated between the electrodes, and then was converted to glow discharge. The surface of the material H13 steel was subjected to pretreatment under designated pressure in the container, such as 1.3 Pa-50 Pa.

F) After the material H13 steel was pretreated, the container pressure control system (11)(12) was activated to make the pressure in the first container reach 1.3 Pa.

G) Mist was formed:

The container temperature system (8)(9) was activated to maintain the temperature T of the first container (1) at 300° C.

Since the pressure at outlet of the second container (22) and the pressure in the first container (1) reached 1.3 Pa, the compound temperature system (23)(24) was activated to make the temperature of A: $AlCl_3$ in the second container (22) exceeding 100° C. A gasified and entered into the container.

The concentration of gas compound $AlCl_3$ in the first container was increased gradually; then, the pressure in the first container was increased. The container pressure control system (11)(12) was activated to maintain the pressure of the container at 133 Pa; inert gas in the container was decreased gradually, gas Ar was decreased gradually and approached zero; there was only gas $AlCl_3$ in the first container (1).

The regional temperature system (8')(9') was activated to make the temperature T in the container, near the case of the first container less than $T_0$, such as 80° C.; some gas A: $AlCl_3$ was converted into liquid or solid, which was suspended in gas A to form mist A(m); or the temperature control system (8)(9) was activated to make the temperature in the first container less than $T_0$ to form mist A(m).

H) The compound temperature system (23) (24) and compound pressure system (25) (26) were activated to maintain the compound $AlCl_3$ in the first container at a designated quantity.

I) High voltage power supply system (4) was activated to generate a voltage of 350-1500 V, which was adjusted according to the requirements of diffusion layer of mold steel. Under the action of electric field, mist spark and arc discharge were generated between the electrodes for several minutes or tens of minutes.

J) (6) (7) (8) (9) (11) (12) were utilized to adjust the temperature and pressure; power supply system (4) were utilized to adjust the voltage and electric current between the two electrodes, so as to convert mist spark and arc discharge into mist gas glow discharge. The temperature of mold steel C was increased continuously to a designated temperature $T_1$, such as 560° C., according to the requirements of the diffusion layer of the steel. Mist $AlCl_3$ was decomposed around the mold steel at 560° C.: $2AlCl_3 \rightarrow 2Al+3Cl_2$, thereby forming mist D(m). Mist gas discharge was held for 1 hour (depending on the requirements of the diffusion layer of the steel).

K) $NH_3$ was introduced, and the pressure in the first container was increased. The container pressure system was activated to maintain the pressure in the first container at 133 Pa; gas $AlCl_3$ was decreased to achieve a certain ratio, such as 10% $AlCl_3$: 90% $NH_3$, according to the requirements of the diffusion layer.

L) According to the requirements of mold steel diffusion layer, the discharge was maintained at a designated temperature, such as 550° C., for 6 hour (depending on the requirements of high speed steel diffusion layer).

Under the physical/chemical action of mist gas discharge, $Fe_4N$, $Fe_2N$, etc. were formed on the surface of mold steel (5), which has a thickness more than 50% greater than that obtained by conventional ion nitriding using the same time and temperature.

By the same process as described above, various steels and various metals such as Ni, Ti, Cu, Mo, Nb, W, and alloys thereof were placed on the cathode, thereby nitrogen compound diffusion layers were formed on the surface.

Example 9

Forming carbonizing and nitriding layer on the surface of metals by mist gas discharge Mist A(m): $NH_4Cl$, $T_0=162°$ C., saturated vapor pressure $P_0=133$ Pa.

Modified material C: 35CrMo steel

The equipments employed in the example were as described in Example 1.

A) The material to be modified, 35CrMo steel, was placed in the specific device (5) on the cathode.

B) Solid compound $NH_4Cl$ was placed inside or outside the first container (1).

C) The container pressure control system (11) (12) was activated to form a negative pressure in the sealed container.

D) When the pressure in the first container reached 1.3 Pa, the aeration system (11) was activated, and pretreating gas $N_2$ was introduced via gas inlet (10).

E) Power supply system (4) was activated, and 0-1500V adjustable direct current or pulse high voltage was generated. Spark and arc discharge was generated between the electrodes, and then was converted to glow discharge. The surface of the material 35CrMo steel was subjected to pretreatment under designated pressure in the container, such as 1.3 Pa-50 Pa.

F) After the material 35CrMo steel was pretreated, the container pressure control system (11)(12) was activated to make the pressure in the first container reach 1.3 Pa.

G) Mist was formed:

The container temperature system (8)(9) was activated to maintain the temperature T of the first container (1) at 170° C.

Since the pressure at outlet of the second container (22) and the pressure in the first container (1) reached 1.3 Pa, the compound temperature system (23)(24) was activated to make the temperature of A: $NH_4Cl$ in the second container (22) exceeding 190° C. A gasified and entered into the container.

The concentration of gas compound $NH_4Cl$ in the first container was increased gradually; then, the pressure in the first container was increased. The container pressure control system (11)(12) was activated to maintain the pressure in the container at 133 Pa; $N_2$ gas was decreased gradually, there were $NH_4Cl$ and $N_2$ gases in the first container (1).

The regional temperature system (8')(9') was activated to make the temperature near the case of the first container less than critical temperature, i.e., 150° C. Some gas A: $NH_4Cl$ was converted into liquid or solid, which was suspended in gas A to form mist A(m); or the temperature control system (8)(9) was activated to make the temperature in the first container less than $T_0$ to form mist A(m).

H) The compound temperature system (23) (24) and compound pressure system (25) (26) were activated to maintain the compound $NH_4Cl$ in the first container at a designated quantity.

I) Ethanol $CH_3CH_2OH$ (100 Pa, boiling point being −31.3° C.) was introduced and achieved a certain ratio, e.g., $CH_3CH_2OH$ 40%, $NH_4Cl$ 30%, $N_2$ 30%, and the pressure was maintained at 133 Pa.

J) High voltage power supply system (4) was activated to generate a voltage of 350-1500 V, which was adjusted according to the requirements of diffusion layer of 35CrMo steel. Spark and arc discharge were generated between the electrodes for several minutes or tens of minutes. (6) (7) (8) (9) (11) (12) were utilized to adjust the temperature, pressure and the voltage between the two electrodes, and the spark and arc discharge were converted into glow discharge. The temperature of 35CrMo steel was increased continuously to designated temperature, such as 550° C., according to the requirements of the diffusion layer of the steel.

K) Under the action of mist gas discharge, mists $NH_4Cl$ and $CH_3CH_2OH$ were decomposed around the 35CrMo steel at 550° C. Mist gas discharge was held for 4 hours (depending on the requirements of the diffusion layer of 35CrMo steel).

Under the physical/chemical action of mist gas discharge, nitriding and carbonizing layers were formed on the surface of 35CrMo steel (5).

By the same process as described above, various steels and various metals such as Cr, Ti, Cu, Al, Mg and alloys thereof were placed on the cathode, thereby nitrogen-carbon compound layers were formed on the surface.

Example 10

Forming iron nitride and titanium nitride layers on the surface of metals by mist gas discharge Mist A(m): $NH_4Cl$, $T_0$=162° C., saturated vapor pressure $P_0$=133 Pa.

Modified material C: W18Cr4V steel

The equipments employed in the example were as described in Example 1.

A) The material to be modified, i.e. W18Cr4V steel, was placed in the specific device (5) on the cathode.

B) Solid compound $NH_4Cl$ was placed inside or outside the first container (1).

C) The container pressure control system (11) (12) was activated to form a negative pressure in the first container.

D) When the pressure in the first container reached 1.3 Pa, the aeration system (11) was activated, and pretreating gas Ar was introduced via gas inlet (10).

E) Power supply system (4) was activated, and 0-1500 V adjustable direct current or pulse high voltage was generated. Spark and arc discharge was generated between the electrodes, and then was converted to glow discharge. The surface of the material W18Cr4V steel was subjected to pretreatment under designated pressure of the container, such as 1.3 Pa-50 Pa.

F) After the material W18Cr4V steel to be modified was pretreated, the container pressure control system (11)(12) was activated to make the pressure in the first container reach 1.3 Pa.

G) Mist was formed:

The temperature control system (8)(9) was activated to maintain the temperature T of the first container (1) at 170° C.

Since the pressure at outlet of the second container (22) and the pressure in the first container (1) reached 1.3 Pa, the compound temperature system (23)(24) was activated to make the temperature of A: $NH_4Cl$ in the second container (22) exceeding 190° C. A gasified and entered into the container. The concentration of gas compound $NH_4Cl$ in the sealed container was increased gradually; then, the pressure in the sealed container was increased.

The container pressure control system (11)(12) was activated to maintain the pressure of the container at 133 Pa; Ar gas was decreased gradually, there was only $NH_4Cl$ gas in the container.

The regional temperature system (8')(9') was activated to make the temperature near the material C in the first container or the temperature of the container case less than $T_0$, i.e., 120° C. Some gas A: $NH_4Cl$ was transformed into micro/nano liquid or solid, which was suspended in gas A to form mist A(m); or the temperature control system (8)(9) was activated to make the temperature of the container less than $T_0$ to form mist A(m).

H) The compound temperature system (23) (24) and compound pressure system (25) (26) were activated to maintain the compound $NH_4Cl$ in the first container at a designated quantity.

I) High voltage power supply system (4) was activated to generate a voltage of 350-1500 V, which was adjusted according to the requirements of diffusion layer of W18Cr4V steel. Under the action of electric field, mist spark and arc discharge were generated between the electrodes for several minutes or tens of minutes.

J) (6) (7) (8) (9) (11) (12) were utilized to adjust the temperature; power supply system (4) was activated to adjust the voltage and current between the two electrodes to convert mist spark and arc discharge into glow discharge. The temperature of W18Cr4V steel was increased continuously to designated temperature $T_1$, such as 550° C., according to the requirements of the diffusion layer of the steel.

K) Under the action of mist gas discharge, mist $NH_4Cl$ was decomposed around the steel: $2NH_4Cl \rightarrow N_23H_2+2HCl$ Mist gas discharge was held for 4 hours (depending on the requirements of the diffusion layer of the steel).

L) $TiCl_4$ gas and $NH_3$ were introduced to make $TiCl_4$, $NH_4Cl$ and $NH_3$ to reach a certain ratio, such as 60% $TiCl_4$, 30% $NH_3$, 10% $NH_4Cl$, according to the requirements of diffusion layer.

M) According to the requirements of mold steel diffusion layer, the discharge was maintained at a designated temperature, such as 550° C., for 20 minutes (depending on the requirements of the diffusion layer of the high speed steel).

Under the physical/chemical action of mist gas discharge, $Fe_4N$, $Fe_2N$, TiN were formed on the surface of mold steel (5).

By the same process as described above, various steels and various metals such as Cr, Ti, Cu, Al, Mg, and alloys thereof were placed on the cathode, thereby nitrogen compound layers were formed on the surface.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A process for generating mist and forming new material or modifying a material by mist gas discharge, the process comprising the steps of:
   1) providing a first container, the pressure P and the temperature T in the first container or some specific region of a part of the first container being settable; and providing a material to be modified or a device, wherein a new material that is to be formed is placed R within the device, placing the material to be modified or the device in the first container;
   2) introducing a pretreating gas, and generating gas discharge to pretreat the device or the material to be modified;
   3) heating or cooling the device or the material to be modified in the first container to a designated temperature and holding at the designated temperature;
   4) providing a second container, in which a solid or liquid elementary substance and/or compound is provided therein, the second container being placed inside or outside the first container;
   5) generating mist as follows: altering the temperature and/or pressure in the second container to gasify the solid or liquid elementary substance and/or compound in the second container and make the gasified solid or liquid elementary substance and/or compound in the second container enter into the first container to generate mist, the mist formed by either raising the pressure P of at least the specific region of the part of the first container to be more than $P_0$ while maintaining the temperature T of the first container at $T_0$ or lowering the temperature T of the first container to be less than $T_0$ while maintaining the pressure P of the first container at $P_0$, where $P_0$ is saturated vapor pressure of the solid or liquid elementary substance and/or compound in the second container at temperature $T_0$, and the mist being dispersed in the first container or at least in the specific region of the part of the first container;
   6) turning on a power supply equipment, generating mist gas discharge between two electrodes in the first container to form new material in the device or to modify the material by the mist gas discharge.

2. The process according to claim 1, wherein the mist gas discharge is either a unitary mist gas discharge or multiple mist gas discharges.

3. The process according to claim 1, wherein PVD, CVD, or sputtering can be carried out with the mist gas discharge alternately.

4. The process according to claim 1, wherein the material to be modified is an elementary substance or compound, including: metals and alloys thereof, ceramics, glass, glass fibers, graphite, diamond, carbon fiber; polymers; natural fibers, artificial fibers and synthetic fibers.

* * * * *